United States Patent
Wen et al.

(10) Patent No.: US 9,857,420 B2
(45) Date of Patent: Jan. 2, 2018

(54) METHOD FOR DETERMINING A CONDITION OF PIN CONNECTION OF THE INTEGRATED CIRCUIT AND INTEGRATED CIRCUIT THEREOF

(71) Applicant: AU Optronics Corp., Hsin-Chu (TW)

(72) Inventors: Chun-Kuei Wen, Hsin-Chu (TW);
Hung-Min Shih, Hsin-Chu (TW);
Che-Yu Kuo, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 79 days.

(21) Appl. No.: 14/736,252

(22) Filed: Jun. 10, 2015

(65) Prior Publication Data

US 2016/0231377 A1     Aug. 11, 2016

(30) Foreign Application Priority Data

Feb. 11, 2015   (TW) .............................. 104104593 A

(51) Int. Cl.
*G01R 31/28*     (2006.01)
*G01R 31/317*    (2006.01)

(52) U.S. Cl.
CPC ... *G01R 31/2896* (2013.01); *G01R 31/31717* (2013.01)

(58) Field of Classification Search
CPC .......... G01R 31/2853; G01R 31/31725; G01R 31/2896
USPC ....................................... 324/762.01–762.03
See application file for complete search history.

(56) References Cited

U.S. PATENT DOCUMENTS

| | | | |
|---|---|---|---|
| 6,727,834 B2 | 4/2004 | Roberts | |
| 7,501,832 B2 * | 3/2009 | Spuhler | .................... 324/762.02 |
| 7,626,411 B2 | 12/2009 | Shimizume | |
| 2015/0015271 A1 | 1/2015 | Hsu | |
| 2015/0362550 A1 * | 12/2015 | Wibben | ............. G01R 31/2853 324/750.3 |
| 2016/0131696 A1 * | 5/2016 | Forster | ................. G01R 31/007 327/1 |

FOREIGN PATENT DOCUMENTS

| | | |
|---|---|---|
| TW | 201025523 A1 | 7/2010 |
| TW | 201502540 A | 1/2015 |

* cited by examiner

*Primary Examiner* — Walter L Lindsay, Jr.
*Assistant Examiner* — Milton Gonzalez
(74) *Attorney, Agent, or Firm* — Locke Lord LLP; Tim Tingkang Xia, Esq.

(57) ABSTRACT

An integrated circuit includes a sensing output terminal, a driver, a first sensing input terminal, a second sensing input terminal and a sensor. The driver is used to transmit a sensing test signal through the sensing output terminal. The first sensing input terminal is coupled to the sensing output terminal through a first external circuit for receiving the sensing test signal. The second sensing input terminal is coupled to the sensing output terminal through a second external circuit for receiving the sensing test signal. The sensor is used to compare the sensing test signals received by the first sensing input terminal and the second sensing input terminal with a clock signal respectively to generate a first comparison result and a second comparison result.

19 Claims, 8 Drawing Sheets

METHOD FOR DETERMINING A CONDITION OF PIN CONNECTION OF THE INTEGRATED CIRCUIT AND INTEGRATED CIRCUIT THEREOF

BACKGROUND OF THE DISCLOSURE

1. Field of the Disclosure

This disclosure relates to an integrated circuit, and more particularly, to an integrated circuit capable of helping a user to determine a condition of pin connection of the integrated circuit.

2. Description of the Prior Art

To meet consumers' requirement, integrated circuits in an electronic device are usually coupled to other circuits through different types of wire according to the mechanism design of the electronic device. For example, an integrated circuit for processing image data on a display panel of a notebook may have pins coupled to other circuits through flexible printed circuit or a printed circuit board on a glass panel. Since integrated circuits, such as the integrated circuit for processing image data, may be disposed in a rather complicated position of the mechanism of the electronic device, it may be rather difficult to discover the cause of the issue when the electronic device is not functioning normally.

In prior art, to discover the cause of the issue, the condition of pin connection of the integrated circuit will be examined, namely, to examine whether each of pins of the integrated circuit is connected to the corresponding circuit properly. Since some of the pins may be coupled to other circuits through a flexible printed circuit, the condition of pin connection cannot be observed by appearance. Therefore, the mechanism of the electronic device has to be opened so that the resistance between the pins of the integrated circuit and the external circuit may be examined by a measurement device such as a Volt-Ohm meter. If the resistance is greater than a normal value, then the condition of pin connection of the integrated circuit may be abnormal. However, due to the small size of the integrated circuit, it may be even more difficult to measure the resistance with a measurement device while the connection of the integrated circuit is complicated. In addition, when using a measurement device, the opened mechanism may require a further process to recover, and sometimes, the damage caused by opening the mechanism may be unrepairable. Therefore, how to determine a condition of pin connection of the integrated circuit effectively has become a critical issue to be solved.

SUMMARY OF THE DISCLOSURE

One embodiment of the present disclosure discloses an integrated circuit. The integrated circuit includes a first sensing output terminal, a driver, a first sensing input terminal, a second sensing input terminal and a sensor. The driver may transmit a first sensing test signal through the first sensing output terminal. The first sensing input terminal may receive the first sensing test signal and may be coupled to the first sensing output terminal through a first external circuit. The second sensing input terminal may receive the first sensing test signal and may be coupled to the first sensing output terminal through a second external circuit. The sensor may be coupled to the first sensing input terminal and the second sensing input terminal. The sensor may compare the first sensing test signal received by the first sensing input terminal with a clock signal to generate a first comparison result and compare the first sensing test signal received by the second sensing input terminal with the clock signal to generate a second comparison result. The first sensing test signal may be a Pulse Width Modulation (PWM) signal.

Another embodiment of the present disclosure discloses a method for determining a condition of pin connection of an integrated circuit. The integrated circuit may include a first sensing output terminal, a first sensing input terminal and a second sensing input terminal. The method may include transmitting a first sensing test signal through the first sensing output terminal, the first sensing input terminal receiving the first sensing test signal through a first external circuit, the second sensing input terminal receiving the first sensing test signal through a second external circuit, comparing the first sensing test signal received by the first sensing input terminal with a clock signal to generate a first comparison result, comparing the first sensing test signal received by the second sensing input terminal with the clock signal to generate a second comparison result, and determining a condition of pin connection of the integrated circuit according to the first comparison result and the second comparison result. The first sensing test signal may be a Pulse Width Modulation (PWM) signal.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
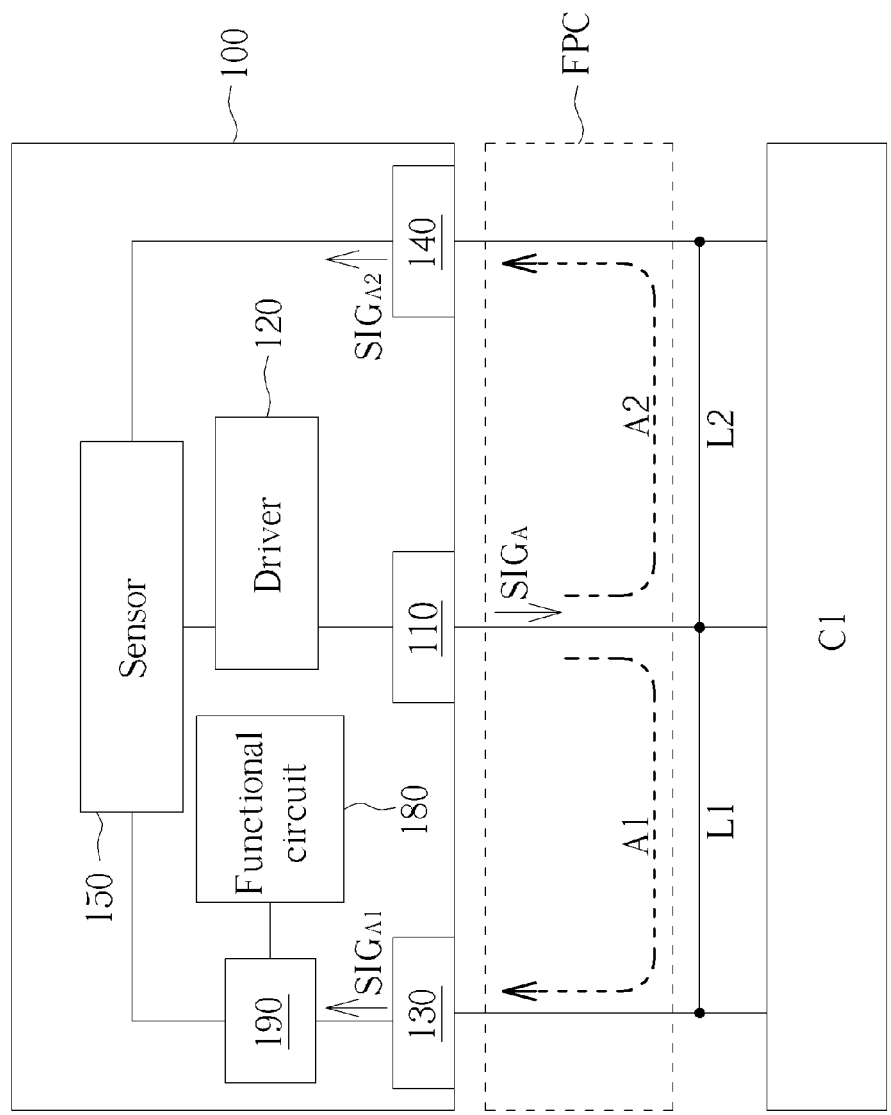
FIG. 1 shows an integrated circuit according to one embodiment of the present disclosure.

FIG. 1 shows an integrated circuit 100 according to one embodiment of the present disclosure. The integrated circuit 100 may include a sensing output terminal 110, a driver 120, sensing input terminals 130 and 140, and a sensor 150. The driver 120 may transmit a sensing test signal $SIG_A$ through the sensing output terminal 110. The sensing input terminal 130 may be coupled to the sensing output terminal 110 through an external circuit A1 so that the sensing input terminal 130 may receive the sensing test signal transmitted from the sensing output terminal 110 through the external circuit A1. The sensing input terminal 140 may be coupled to the sensing output terminal 110 through an external circuit A2 so that the sensing input terminal 140 may receive the sensing test signal transmitted from the sensing output terminal 110 through the external circuit A2. In FIG. 1, although the driver 120 and the sensor 150 are represented as two different hardware units, however, the present disclosure is not limited to use two different hardware units for the driver and the sensor. In some embodiments of the present disclosure, the driver 120 and the sensor 150 may be designed in the same hardware unit.

The sensor 150 may be coupled to the sensing input terminals 130 and 140. Since the sensing test signal $SIG_A$ may be decayed after passing through the external circuit A1, the sensing test signal $SIG_{A1}$ received by the sensing input terminal 130 may be different from the sensing test signal $SIG_A$. The sensor 150 may compare the sensing test signal $SIG_{A1}$ received by the sensing input terminal 130 with a clock signal CK to generate a first comparison result and compare the sensing test signal $SIG_{A2}$ received by the sensing input terminal 140 with the clock signal CK to generate a second comparison result. The sensor 150 may generate the clock signal CK itself or use a clock signal generated by another circuit in the integrated circuit 100 as the clock signal CK. According to the first comparison result and the second comparison result, the condition of pin connection between the sensing input terminal 130 and the external circuit A1 and the condition of pin connection between the sensing input terminal 140 and the external circuit A2 can be determined.

Figure 2:
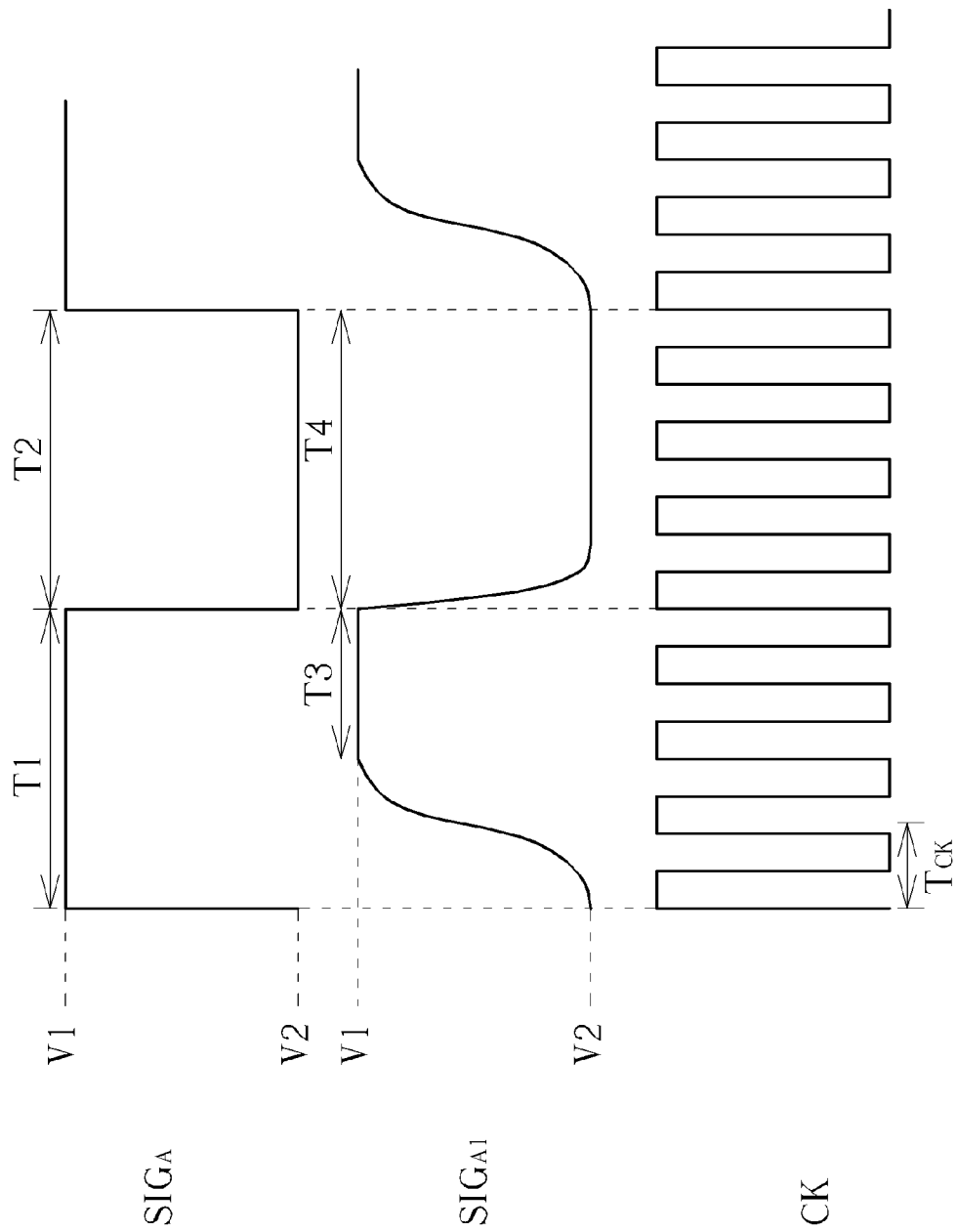
FIG. 2 shows a comparison between a clock signal and a sensing test signal.

FIG. 2 shows a comparison between the clock signal CK, the sensing test signal $SIG_A$ and the sensing test signal $SIGA_1$ according to one embodiment of the present disclosure. In the embodiment of FIG. 2, the sensing test signal $SIG_A$ may be a Pulse Width Modulation (PWM) signal with a duty cycle of ½ (50%). That is, the time T1 the sensing test signal $SIG_A$ at the high voltage level V1 is equal to the time T2 the sensing test signal $SIG_A$ at the low voltage level V2. Since the external circuit A1 is resistive in practical, the sensing test signal $SIG_{A1}$ received by the sensing input terminal 130 may be delayed so the time T3 the sensing test signal $SIG_{A1}$ at the high voltage level V1 may be shorter than the time T4 the sensing test signal $SIG_{A1}$ at the low voltage level V2. That is, the duty cycle of the sensing test signal $SIG_{A1}$ may be smaller than ½. The greater the resistance of the external circuit A1 is, the more the waveform of the sensing test signal $SIG_{A1}$ is delayed and distorted, and the shorter the duty cycle of the sensing test signal $SIG_{A1}$ is. The less the resistance of the external circuit A1 is, the more similar the sensing test signal $SIG_{A1}$ and the sensing test signal $SIG_A$ are.

The sensor 150 may compare the sensing test signal $SIG_{A1}$ with the clock signal CK to see the relationship between the lengths of the time T3 and the time T4 to derive the duty cycle of the sensing test signal $SIG_{A1}$. In some embodiments of the present disclosure, the duty cycle of the sensing test signal $SIG_{A1}$ may be represented as T3/(T3+T4). In FIG. 2, since the time T3 is about two times the cycle time $T_{CK}$ of the clock signal CK and the time T4 is about four times the cycle time $T_{CK}$ of the clock signal CK, the duty cycle of the sensing test signal is 33.33%. In other embodiments of the present disclosure, clock signal with even higher frequency may be used to compare with the sensing test signals for deriving the duty cycle even more accurately. In addition, although the duty cycle is derived by considering the time T3 the sensing test signal $SIG_{A1}$ at the high voltage level V1 as an identifying indicator in the aforementioned embodiments, the present disclosure is not limited to use the high voltage level V1 as the identifying indicator to derive the duty cycle. In other embodiments of the present disclosure, the duty cycle may also be derived by considering the time that the sensing test signal is over a voltage level of 75% of the high voltage level V1 as an identifying indicator, or other identifying indicators.

Figure 3:
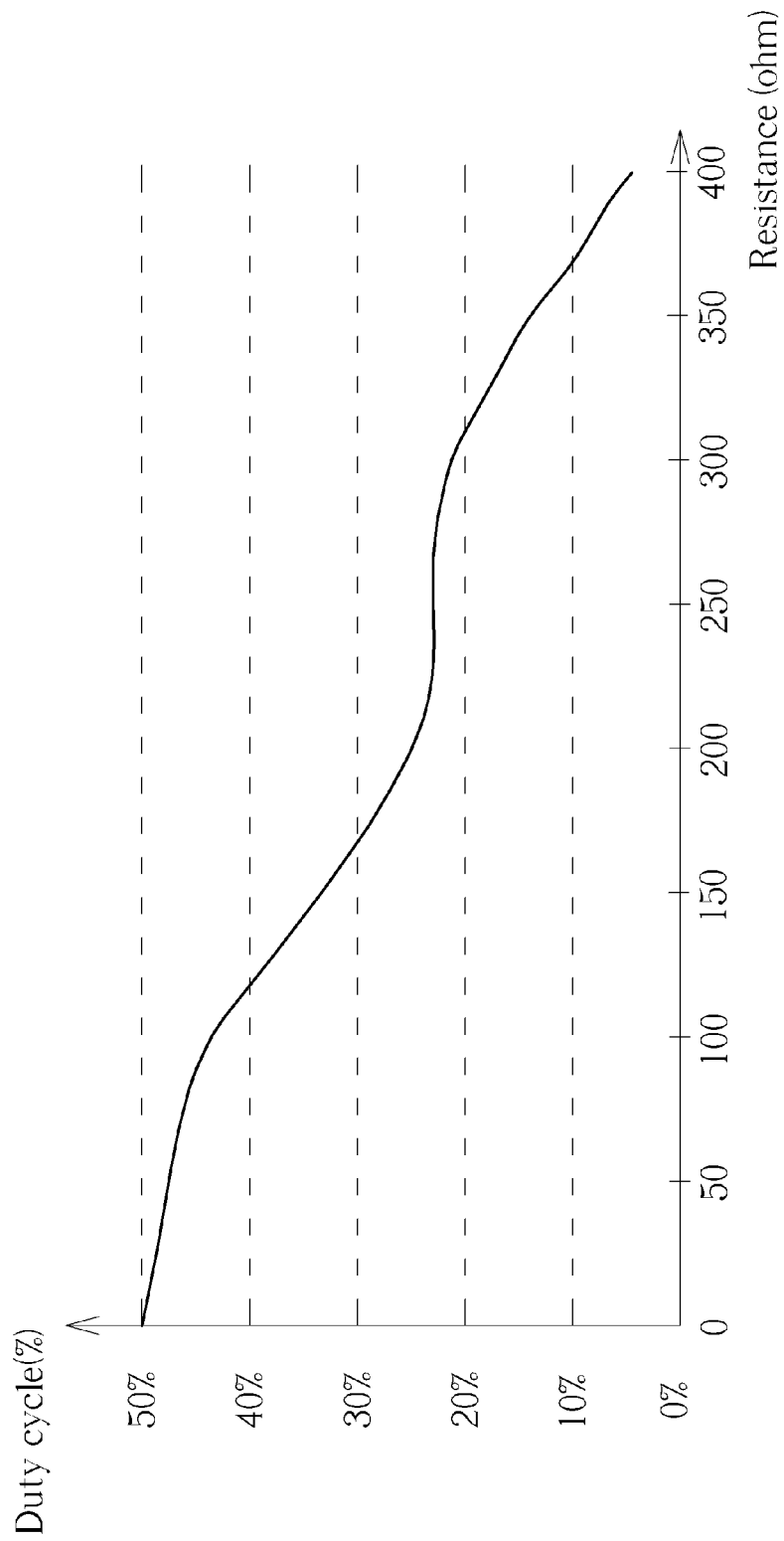
FIG. 3 shows a diagram interpreting a relation between a duty cycle of a sensing test signal and a resistance of an external circuit.

In some embodiments of the present disclosure, the first comparison result generated by the sensor 150 by comparing the sensing test signal $SIG_{A1}$ with the clock signal CK may include the information of duty cycle of the sensing test signal $SIG_{A1}$. According to the duty cycle of the sensing test signal $SIG_{A1}$, the resistance of the external A1 may be derived. FIG. 3 shows a curve diagram interpreting a relation between the duty cycle of the sensing test signal (measured by unit of %) and a resistance (measured by unit of ohm). However, the relation between the resistance and the duty cycle of the sensing test signal of the present disclosure is not limited to the relation shown in FIG. 3. In other embodiments of the present disclosure, the relation between the duty cycle and the resistance may be varied with the functions of the integrated circuit or the applications of the system. According to the relation between the duty cycle and the resistance in FIG. 3, when the duty cycle of the sensing test signal $SIG_{A1}$ received by the sensing input terminal 130 is 50%, that is when the duty cycle of the sensing test signal $SIG_{A1}$ is same as the duty cycle of the sensing test signal $SIG_A$ transmitted by the sensing output terminal 110, the resistance of the external circuit A1 may be derived as 0 ohm. When the duty cycle of the sensing test signal $SIG_{A1}$ received by the sensing input terminal 130 is 33.33%, the resistance of the external circuit A1 may be derived as 150 ohm for the sensing test signal $SIG_{A1}$ may be delayed by the resistance of the external circuit A1. Consequently, the resistance of the external circuit A1 may be derived by the duty cycle of the sensing test signal $SIG_{A1}$.

Similarly, the sensor 150 may also compare the sensing test signal $SIG_{A2}$ with the clock signal CK to generate the second comparison result, and the second comparison result may include the information of the duty cycle of the sensing test signal $SIG_{A2}$. Consequently, the user may determine the condition of pin connection of the integrated circuit 100 according to the duty cycles of the sensing test signals $SIG_{A1}$ and $SIG_{A2}$ in the first comparison result and the second comparison result. For example, if the duty cycle of the sensing test signal $SIG_{A1}$ is obviously greater than the duty cycle of the sensing test signal $SIG_{A2}$, it may imply that the resistance of the external circuit A1 may be excessively big so the condition of the connection between the sensing input terminal 130 and the external circuit A1 may be defective.

In some embodiments of the present disclosure, when the driver 120 does not transmit the sensing test signals $SIG_{A1}$, the sensing output terminal 110, and the sensing input terminals 130 and 140 may further be configured to be an input terminal or an output terminal for other signals of the integrated circuit 100. That is, the integrated circuit 100 may be used for a main function normally and may only activate the driver 120 to transmit the sensing test signal $SIG_A$ when the user wants to know the condition of pin connection. Thus, the sensing output terminal 110 and the sensing input terminals 130 and 140 may be switched between being used for the main function and used for measuring the condition of pin connection by switches. For example, in FIG. 1, when the integrated circuit 100 executes the main function, the switch 190 may turn on the electrical connection between the functional circuit 180 and the sensing input terminal 130 and turn off the electrical connection between the sensor 150 and the sensing input terminal 130 so that the functional circuit 180 may transmit control signals through the sensing input terminal 130. In this case, the sensing input terminal 130 may be an output terminal of the integrated circuit 100. In contrary, when the user wants to know the condition of the pin connection, the switch 190 may turn off the electrical connection between the functional circuit 180 and the sensing input terminal 130 and turn on the electrical connection between the sensor 150 and the sensing input terminal 130 so that the sensing input terminal 130 may be used for receiving the sensing test signal $SIG_{A1}$. In some embodiments of the present disclosure, since the sensing input terminal 130 may be used for outputting control signal when executing the main function, the issue of low input resistance may occur when the sensing input terminal 130 is used for receiving the sensing test signal. To solve this issue, the sensing input terminal 130 may be coupled to the sensor 150 through an inverter to increase the input resistance.

In some embodiments of the present disclosure, the integrated circuit 100 may be coupled to other circuits through a flexible printed circuit. In FIG. 1, the integrated circuit 100 may be coupled to the accessory circuit C1 through a flexible printed circuit FPC. When the integrated circuit 100 executes its main function, the sensing output terminal 110 and the sensing input terminals 130 and 140 may receive or transmit control signals from or to the accessory circuit C1 through the flexible printed circuit FPC. In this case, the sensing output terminal 110 and the sensing input terminals 130 and 140 may not be electrically coupled to each other. Therefore, when the user wants to measure the condition of pin connection of the integrated circuit 100, the user may dispose a conductive wire L1 at the flexible printed circuit FPC close to accessory circuit C1 to couple the sensing output terminal 110 and the sensing input terminal 130, and dispose a conductive wire L2 to couple the sensing output terminal 110 and the sensing input terminal 140. That is, the external circuit A1 may include the flexible printed circuit FPC and the conductive wire L1, and external circuit A2 may include the flexible printed circuit FPC and the conductive wire L2. When the integrated circuit 100 is used to execute the main function, the conductive wires L1 and L2 may be removed. Consequently, when measuring the condition of pin connection of the integrated circuit 100, one may measure the resistance of the flexible printed circuit FPC in the external circuits A1 and A2 to see if the condition of the connection in the flexible printed circuit FPC is good or not, which may increase the possibility of discovering the cause of issues of the integrated circuit 100 without damaging the mechanism of the electronic device.

Although in FIG. 1, the integrated circuit 100 is coupled to the accessory circuit C1 through the flexible printed circuit FPC, in other embodiments of the present disclosure, the integrated circuit 100 may also be coupled to other circuits through a printed circuit board.

Figure 4:
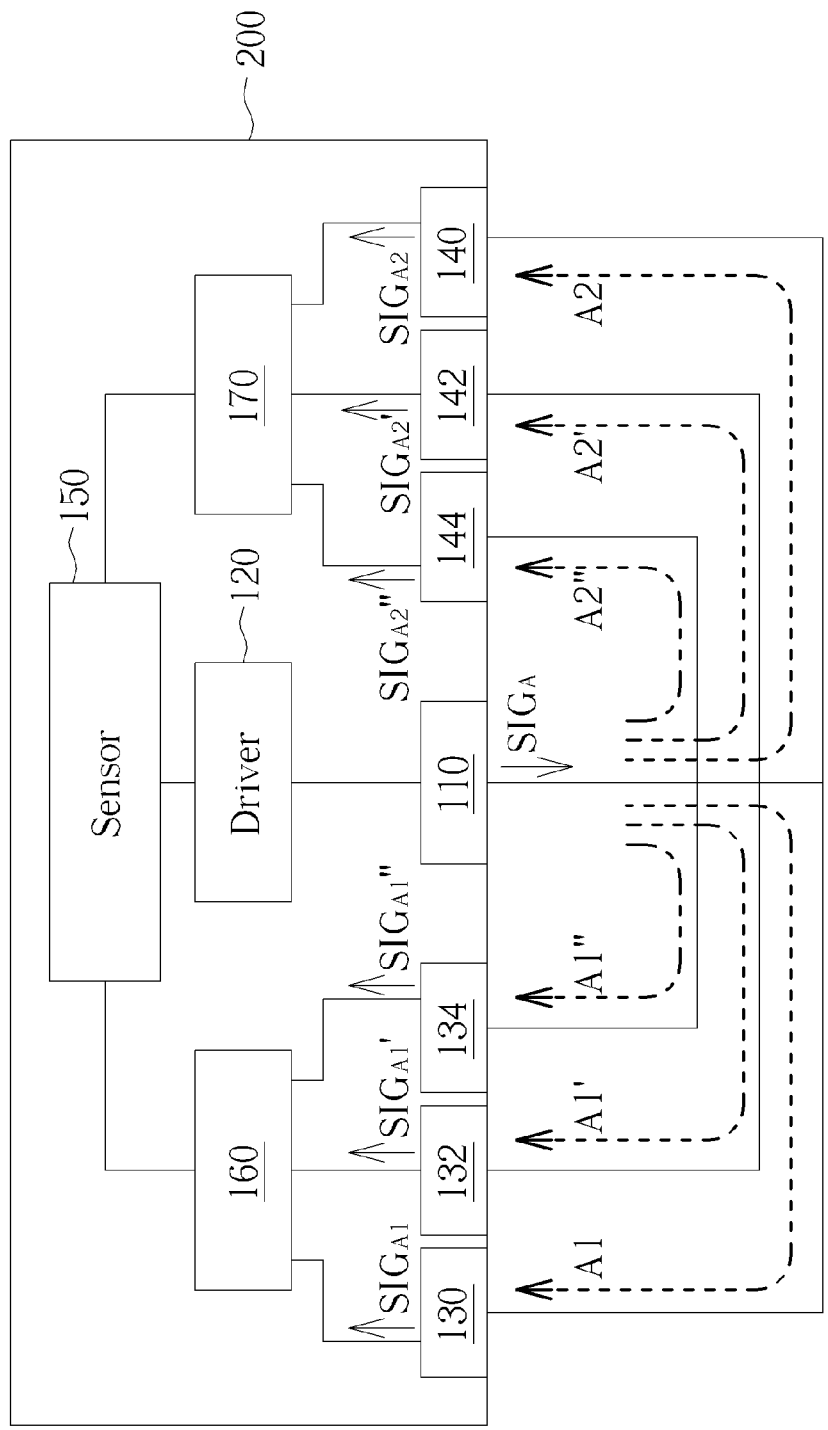
FIG. 4 shows an integrated circuit according to another embodiment of the present disclosure.

FIG. 4 shows an integrated circuit 200 according to another embodiment of the present disclosure. The integrated circuit 200 may have the similar operation principle as the integrated circuit 100. The difference between these two is that the integrated circuit 200 may further include sensing input terminal 132, 134, 142, and 144. The sensing input terminals 132 and 134 may receive the sensing test signal transmitted from the sensing output terminal 110 and may be coupled to the sensing output terminal 110 through the external circuits A1' and A1" respectively. The sensing input terminals 142 and 144 may receive the sensing test signal transmitted from the sensing output terminal 110 and may be coupled to the sensing output terminal 110 through the external circuits A2' and A2" respectively.

In some embodiments of the present disclosure, the integrated circuit 200 may further include switches 160 and 170.

The switch 160 may control the electrical connection between the sensor 150 and the sensing input terminal 130, 132, and 134 to allow the sensor 150 to receive the sensing test signal $SIG_{A1}$ practically received by the sensing input terminal 130, the sensing test signal $SIG_{A1'}$ practically received by the sensing input terminal 132, or the sensing test signal $SIG_{A1''}$ practically received by the sensing input terminal 134. The switch 170 may control the electrical connection between the sensor 150 and the sensing input terminal 140, 142, and 144 to allow the sensor 150 to receive the sensing test signal $SIG_{A2}$ practically received by the sensing input terminal 140, the sensing test signal $SIG_{A2'}$ practically received by the sensing input terminal 142, or the sensing test signal $SIG_{A2''}$ practically received by the sensing input terminal 144.

In some embodiments of the present disclosure, when the user wants to measure the condition of connection between the sensing output terminal 110 and the sensing input terminals 132 and 142, the switch 160 may turn on the electrical connection between the sensing input terminal 132 and the sensor 150, and turn off the electrical connections between the sensor 150 and the sensing input terminals 130 and 134. Also, the switch 170 may turn on the electrical connection between the sensing input terminal 142 and the sensor 150, and turn off the electrical connection between the sensor 150 and the sensing input terminals 140 and 144. In this case, the sensor 150 may generate a third comparison result by comparing the sensing test signal $SIG_{A1'}$ received by the sensing input terminal 132 with the clock signal, and generate a fourth comparison result by comparing the sensing test signal $SIG_{A2'}$ with the clock signal. Thus, the user may determine the condition of connection of the external circuits A1' and A2' according to the third and fourth comparison results.

By turning on and off the electrical connection between each of the sensing input terminals and the sensor 150 with the switches 160 and 170, the condition of pin connection of each terminal in the integrated circuit 200 may be determined. Although in FIG. 4, the integrated circuit 200 may include the sensing input terminal 130, 132, 134, 140, 142, and 144, in other embodiments of the present disclosure, the integrated circuit 200 may include other numbers of sensing input terminals.

In some embodiments of the present disclosure, the distance between the sensing input terminal and the sensing output terminal may affect the resistance of the external circuit. Therefore, the terminal at a middle position of the integrated circuit 200 may be chosen as the sensing output terminal 110, the sensing input terminals 130 and 140 may be at the positions symmetric to each other with respect to the sensing output terminal 110, the sensing input terminals 132 and 142 may be at the positions symmetric to each other with respect to the sensing output terminal 110, and the sensing input terminals 134 and 144 may be at the positions symmetric to each other with respect to the sensing output terminal 110.

Figure 5:
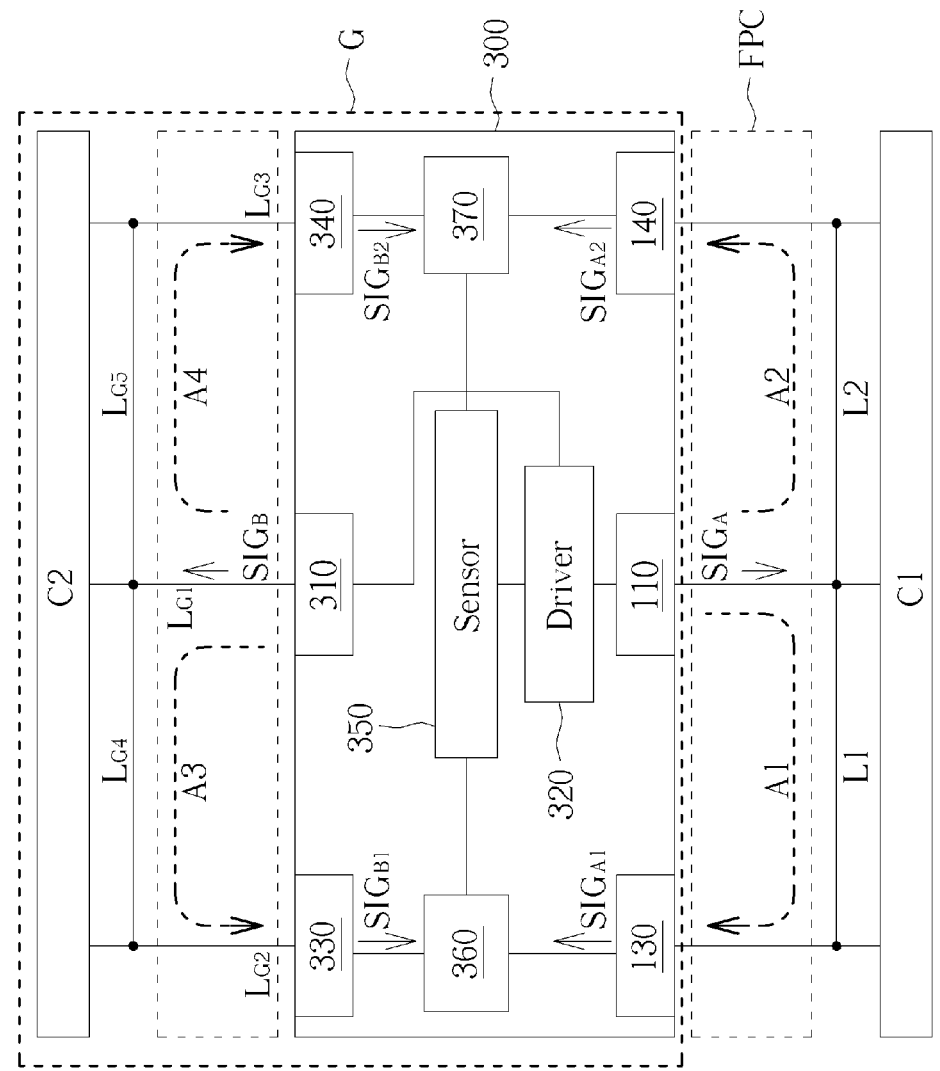
FIG. 5 shows an integrated circuit according to another embodiment of the present disclosure.

FIG. 5 shows an integrated circuit 300 according another embodiment of the present disclosure. The integrated circuit 300 may have a similar operation principle as the integrated circuit 100. The integrated circuit 300 may further include a driver 320, a sensing output terminal 310, sensing input terminals 330 and 340, and a sensor 350. The driver 320 may transmit a sensing test signal SIGA through the sensing output terminal 110 and transmit a sensing test signal SIGB through the sensing output terminal 310. The sensing input terminal 330 may receive the sensing test signal transmitted from the sensing output terminal 310 and may be coupled to the sensing output terminal 310 through an external circuit A3. The sensing input terminal 340 may receive the sensing test signal transmitted from the sensing output terminal 310 and maybe coupled to the sensing output terminal 310 through an external circuit A4.

In some embodiments of the present disclosure, the integrated circuit 300 may further include switches 360 and 370. The switch 360 may control the electrical connection between the sensing input terminal 130, the sensing input terminal 330 and the sensor 350 to allow the sensor 350 to receive the sensing test signal $SIG_{A1}$ practically received by the sensing input terminal 130 or the sensing test signal $SIG_{B1}$ practically received by the sensing input terminal 330. The switch 370 may control the electrical connection between the sensing input terminal 140, the sensing input terminal 340 and the sensor 350 to allow the sensor 350 to receive the sensing test signal $SIG_{A2}$ practically received by the sensing input terminal 140 or the sensing test signal $SIG_{B2}$ practically received by the sensing input terminal 340.

When the user wants to measure the condition of pin connection between the sensing output terminal 110 and the sensing input terminals 130 and 140, the switch 360 may turn on the electrical connection between the sensing input terminal 130 and the sensor 350 and the switch 370 may turn on the electrical connection between the sensing input terminal 140 and the sensor 350. In this case, the sensor 350 may compare the sensing test signal $SIG_{A1}$ received by the sensing input terminal 130 with the clock signal to generate the first comparison result and compare the sensing test signal $SIG_{A2}$ received by the sensing input terminal 140 with the clock signal to generate the second comparison result. When the user wants to measure the condition of pin connection between the sensing output terminal 310 and the sensing input terminals 330 and 340, the switch 360 may turn on the electrical connection between the sensing input terminal 330 and the sensor 350 and the switch 370 may turn on the electrical connection between the sensing input terminal 340 and the sensor 350. In this case, the sensor 350 may compare the sensing test signal $SIG_{B1}$ received by the sensing input terminal 330 with the clock signal to generate a fifth comparison result and compare the sensing test signal $SIG_{B2}$ received by the sensing input terminal 340 with the clock signal to generate a sixth comparison result.

In some embodiments of the present disclosure, the integrated circuit 300 may be an image driving circuit for notebook so the integrated circuit 300 may be disposed on a glass panel G. The integrated circuit 300 may drive the panel circuit C2 on the glass panel G according to the image data transmitted from the accessory circuit C1. The sensing output terminal 110 and the sensing input terminals 130 and 140 of the integrated circuit 300 may be coupled to the accessory circuit C1 through the flexible printed circuit FPC. The sensing output terminal 310 and the sensing input terminals 330 and 340 may be coupled to the panel circuit C2 through the conductive wires $L_{G1}$, $L_{G2}$ and $L_{G3}$ on the glass panel G. When the integrated circuit 300 executes its main function, there may not be any electrical connection between the sensing output terminal 310 and the sensing input terminals 330 and 340. When the user wants to measure the condition of the pin connection of the integrated circuit 300, the user may dispose a conductive wire $L_{G4}$ on the glass panel G to couple the sensing output terminal 310 and the sensing input terminal 330 and dispose a conductive wire $L_{G5}$ on the glass panel G to couple the sensing output terminal 310 and the sensing input terminal 340. Namely, the external circuit A3 may include the conductive wires $L_{G1}$, $L_{G2}$ and $L_{G4}$, and the external circuit A4 may include the conductive wires $L_{G1}$, $L_{G3}$ and $L_{G5}$. After finishing the measurement, the conductive wires $L_{G4}$ and $L_{G5}$ may be removed so that the integrated circuit 300 may execute its main function. Since the external circuit A1 and A3 may have different electrical characteristics, the integrated circuit 300 may transmit sensing test signals with different strengths to measure the resistance of the external circuits A1 and A2 that include the flexible printed circuit FPC and the resistance of the external circuits A3 and A4 that include the conductive wires on the glass panel G according to the different external circuits.

With the integrated circuits 100, 200 and 300, one may determine the condition of pin connection of the integrated circuit effectively without damaging the mechanical design, and may discover the cause of the issue on the electronic device faster.

Figure 6:
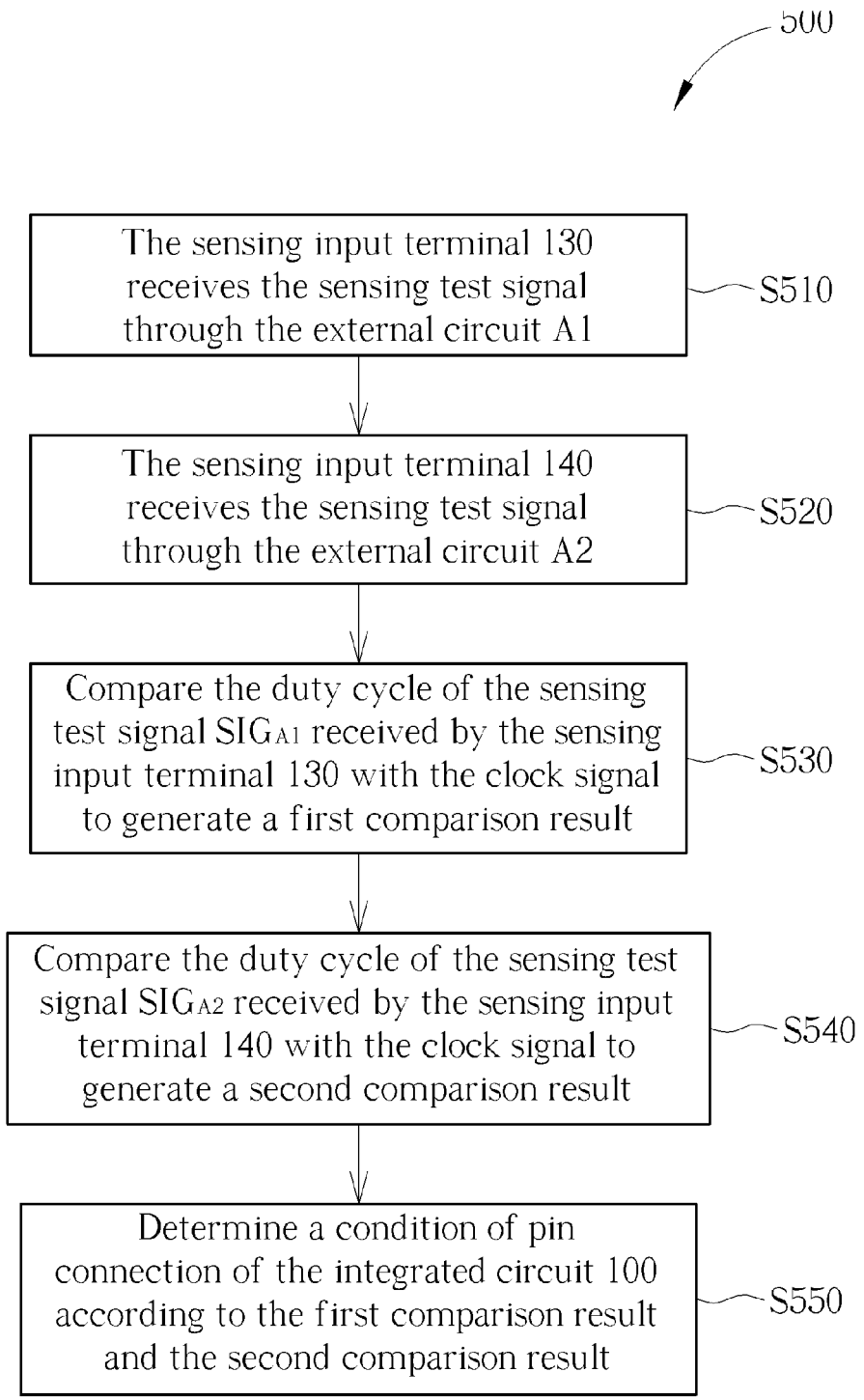
FIG. 6 shows a flow chart of a method for determining a condition of pin connection of the integrated circuit in FIG. 1.

FIG. 6 shows a flow chart of a method 500 for determining a condition of pin connection of the integrated circuit 100. The method 500 may include steps S510-S550:

S510: the sensing input terminal 130 receives the sensing test signal through the external circuit A1;

S520: the sensing input terminal 140 receives the sensing test signal through the external circuit A2;

S530: compare the duty cycle of the sensing test signal $SIG_{A1}$ received by the sensing input terminal 130 with the clock signal to generate a first comparison result;

S540: compare the duty cycle of the sensing test signal $SIG_{A2}$ received by the sensing input terminal 140 with the clock signal to generate a second comparison result;

S550: determine a condition of pin connection of the integrated circuit 100 according to the first comparison result and the second comparison result.

Figure 7:
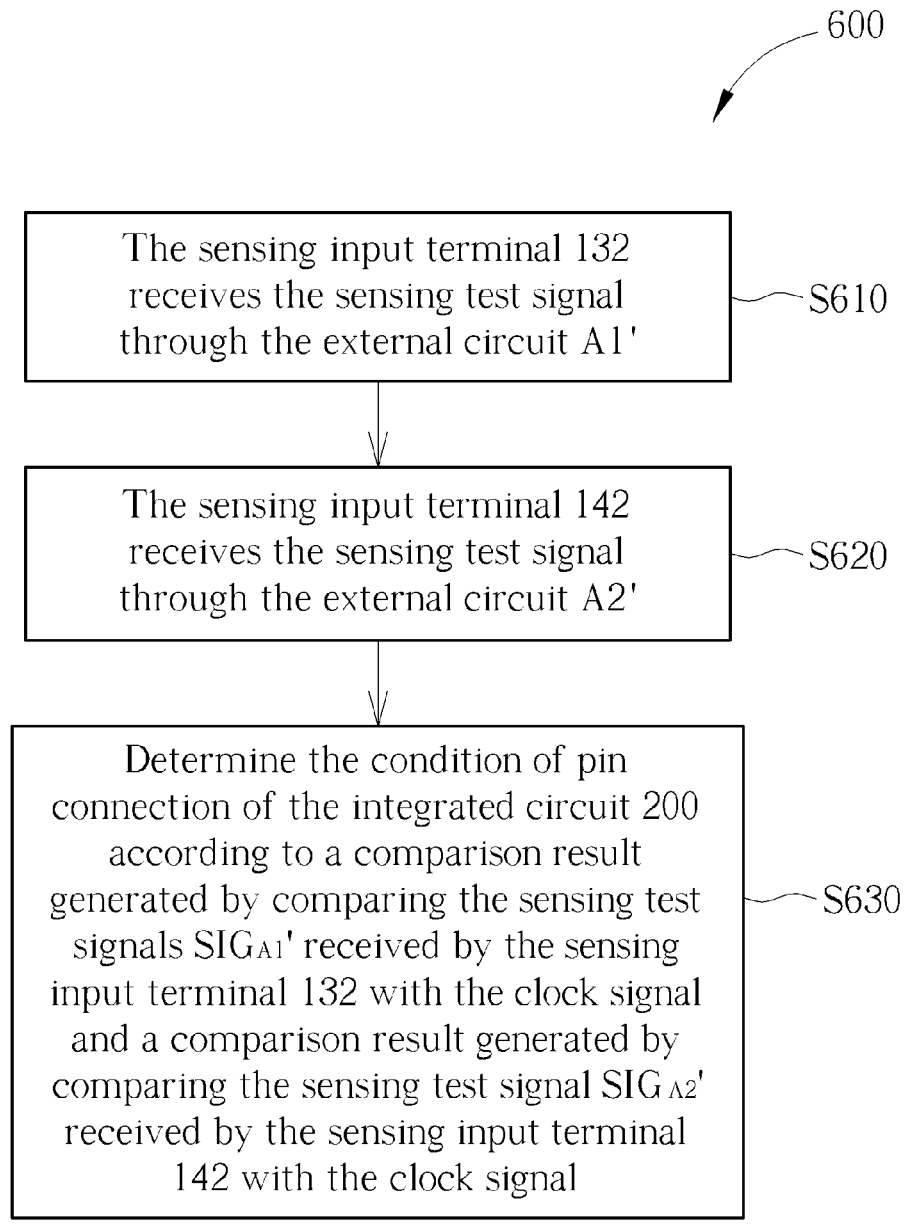
FIG. 7 shows a flow chart of a method for determining a condition of pin connection of the integrated circuit in FIG. 4.

In some embodiments of the present disclosure, the method 500 may also apply to the integrated circuit 200; however, this is not to limit the present disclosure. FIG. 7 shows a flow chart of a method 600 for determining a condition of pin connection of the integrated circuit 200 according to another embodiment of the present disclosure. The method 600 may include steps S610-S630:

S610: the sensing input terminal 132 receives the sensing test signal through the external circuit A1';

S620: the sensing input terminal 142 receives the sensing test signal through the external circuit A2';

S630: determine the condition of pin connection of the integrated circuit 200 according to a comparison result generated by comparing the sensing test signals $SIG_{A1'}$ received by the sensing input terminal 132 with the clock signal and a comparison result generated by comparing the sensing test signal $SIG_{A2'}$ received by the sensing input terminal 142 with the clock signal.

Figure 8:
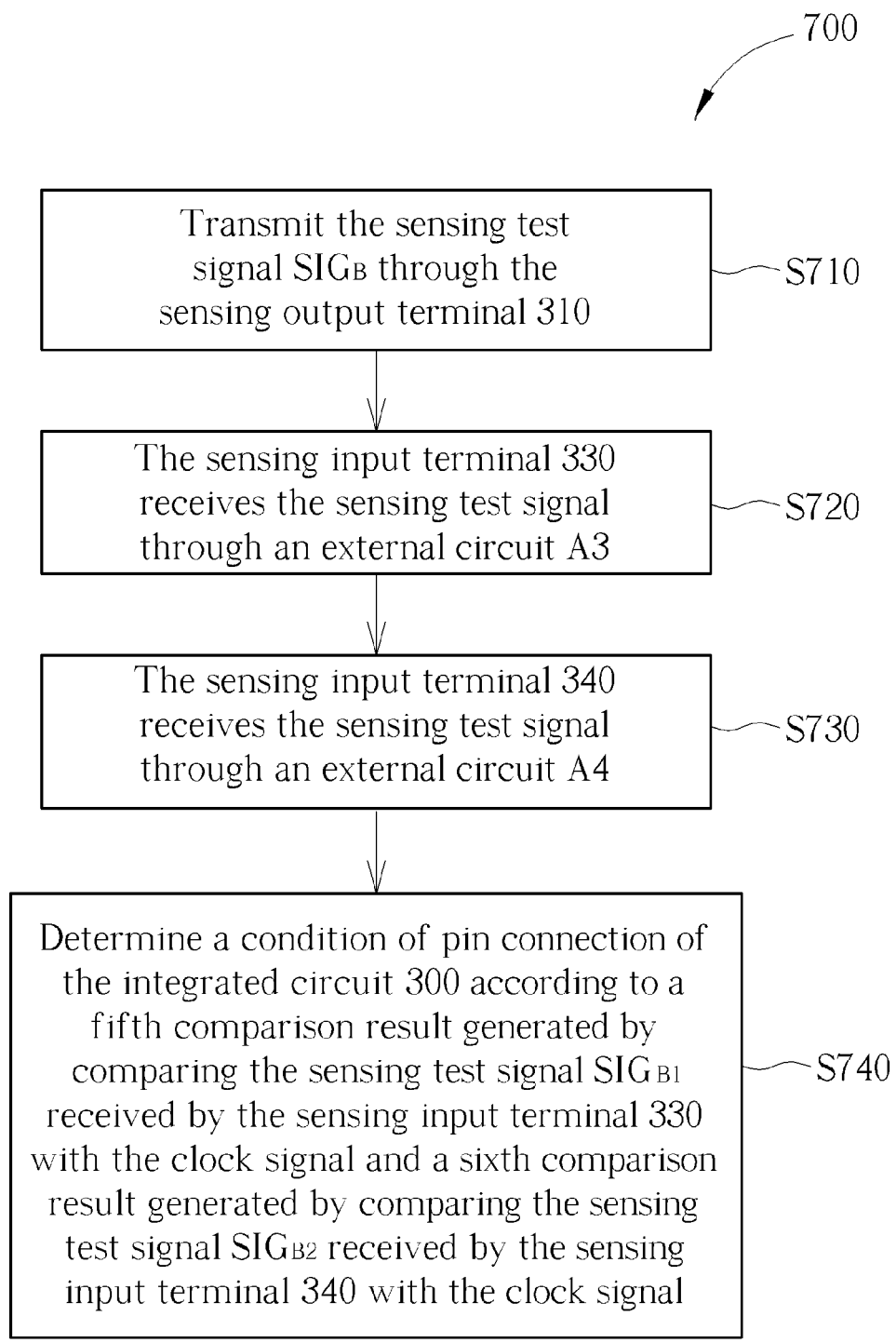
FIG. 8 shows a flow chart of a method for determining a condition of pin connection of the integrated circuit in FIG. 5.

In some embodiments of the present disclosure, the method 600 may also apply to the integrated circuit 300; however, this is not to limit the present disclosure. FIG. 8 shows a flow chart of a method 700 for determining a condition of pin connection of the integrated circuit 300 according to another embodiment of the present disclosure. The method 700 may include steps S710-S740:

S710: transmit the sensing test signal $SIG_B$ through the sensing output terminal 310;

S720: the sensing input terminal 330 receives the sensing test signal through an external circuit A3;

S730: the sensing input terminal 340 receives the sensing test signal through an external circuit A4;

S740: determine a condition of pin connection of the integrated circuit 300 according to a fifth comparison result generated by comparing the sensing test signal $SIG_{B1}$ received by the sensing input terminal 330 with the clock signal and a sixth comparison result generated by comparing the sensing test signal $SIG_{B2}$ received by the sensing input terminal 340 with the clock signal.

With methods 500, 600 and 700, one may determine the condition of pin connection of the integrated circuit effectively without damaging the mechanical design, and may discover the cause of the issue on the electronic device faster.

In summary, according to the integrated circuits and the methods for determining the condition of pin connection of the integrated circuits, one may determine the condition of pin connection of the integrated circuit effectively without damaging the mechanical design, and may discover the cause of the issue on the electronic device faster. Furthermore, since the mechanism is not damaged, the fixing process of the electronic device may be even simplified after knowing the cause of the issue.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An integrated circuit, comprising:
   a first sensing output terminal;
   a driver configured to transmit a first sensing test signal through the first sensing output terminal;
   a first sensing input terminal coupled to the first sensing output terminal through a first external circuit, and configured to receive the first sensing test signal;
   a second sensing input terminal coupled to the first sensing output terminal through a second external circuit, and configured to receive the first sensing test signal; and
   a sensor coupled to the first sensing input terminal and the second sensing input terminal, and configured to compare the first sensing test signal received by the first sensing input terminal with a clock signal to generate a first comparison result and compare the first sensing test signal received by the second sensing input terminal with the clock signal to generate a second comparison result;
   wherein the first sensing test signal is a Pulse Width Modulation (PWM) signal.

2. The integrated circuit of claim 1, wherein when the driver does not transmit the first sensing test signal, the first sensing output terminal, each of the first sensing input terminal and the second sensing input terminal are further configured to be an input terminal or an output terminal for other signals of the integrated circuit.

3. The integrated circuit of claim 1, wherein the first sensing test signal outputted by the first sensing output terminal is a Pulse Width Modulation (PWM) signal with a duty cycle of ½.

4. The integrated circuit of claim 1, further comprising:
   at least one third sensing input terminal configured to receive the first sensing test signal, each of the at least one third sensing input terminal coupled to the first sensing output terminal through a third external circuit; and
   at least one fourth sensing input terminal configured to receive the first sensing test signal, each of the at least one fourth sensing input terminal coupled to the first sensing output terminal through a fourth external circuit;
   wherein the sensor is further configured to compare the first sensing test signal received by each of the at least one third sensing input terminal with the clock signal to generate a third comparison result and compare the first sensing test signal received by each of the at least one fourth sensing input terminal with the clock signal to generate a fourth comparison result.

5. The integrated circuit of claim 4, further comprising:
   a first switch configured to control an electrical connection between the first sensing input terminal, each of the at least one third sensing input terminal and the sensor to allow the sensor to receive the first sensing test signal received by the first sensing input terminal or by one of the at least one third sensing input terminal; and
   a second switch configured to control an electrical connection between the second sensing input terminal, each of the at least one fourth sensing input terminal and the sensor to allow the sensor to receive the first sensing test signal received by the second sensing input terminal or by one of the at least one fourth sensing input terminal.

6. The integrated circuit of claim 4, further comprising:
   a second sensing output terminal;
   a fifth sensing input terminal configured to receive a second sensing test signal and coupled to the second sensing output terminal through a fifth external circuit; and
   a sixth sensing input terminal configured to receive the second sensing test signal and coupled to the second sensing output terminal through a sixth external circuit;
   wherein:
   the driver is further configured to transmit the second sensing test signal through the second sensing output terminal; and
   the sensor is further configured to compare the second sensing test signal received by the fifth sensing input terminal with the clock signal to generate a fifth comparison result and compare the second sensing test signal received by the sixth sensing input terminal with the clock signal to generate a sixth comparison result.

7. The integrated circuit of claim 6, further comprising:
   a third switch configured to control an electrical connection between the first sensing input terminal, the fifth sensing input terminal and the sensor to allow the sensor to receive the first sensing test signal received by the first sensing input terminal or the second sensing test signal received by the fifth sensing input terminal; and
   a fourth switch configured to control an electrical connection between the second sensing input terminal, the sixth sensing input terminal and the sensor to allow the sensor to receive the first sensing test signal received by the second sensing input terminal or the second sensing test signal received by the sixth sensing input terminal.

8. The integrated circuit of claim 6, wherein the integrated circuit is disposed on a glass panel, and each of the fifth external circuit and the sixth external comprises a circuit disposed on the glass panel.

9. The integrated circuit of claim 1, wherein each of the first external circuit and the second external circuit comprises a circuit on a printed circuit board or a circuit on a flexible printed circuit.

10. The integrated circuit of claim 1, further comprising:
a second sensing output terminal;
a fifth sensing input terminal configured to receive a second sensing test signal and coupled to the second sensing output terminal through a fifth external circuit; and
a sixth sensing input terminal configured to receive the second sensing test signal and coupled to the second sensing output terminal through a sixth external circuit;
wherein:
the driver is further configured to transmit the second sensing test signal through the second sensing output terminal; and
the sensor is further configured to compare the second sensing test signal received by the fifth sensing input terminal with the clock signal to generate a fifth comparison result and compare the second sensing test signal received by the sixth sensing input terminal with the clock signal to generate a sixth comparison result.

11. A method for determining a condition of pin connection of an integrated circuit, the integrated circuit comprising a first sensing output terminal, a first sensing input terminal and a second sensing input terminal, the method comprising:
transmitting a first sensing test signal through the first sensing output terminal;
the first sensing input terminal receiving the first sensing test signal through a first external circuit;
the second sensing input terminal receiving the first sensing test signal through a second external circuit;
comparing the first sensing test signal received by the first sensing input terminal with a clock signal to generate a first comparison result;
comparing the first sensing test signal received by the second sensing input terminal with the clock signal to generate a second comparison result; and
determining a condition of pin connection of the integrated circuit according to the first comparison result and the second comparison result;
wherein the first sensing test signal is a Pulse Width Modulation (PWM) signal.

12. The method of claim 11, further comprising:
outputting or inputting a control signal through the first sensing output terminal, the first sensing input terminal or the second input terminal.

13. The method of claim 11, wherein the first sensing test signal transmitted by the first sensing output terminal is a PWM signal with a duty cycle of ½.

14. The method of claim 11, wherein:
the integrated circuit further comprises at least one third sensing input terminal and at least one fourth sensing input terminal; and
the method further comprises:
each of the at least one third sensing input terminal receiving the first sensing test signal through a third external circuit;
each of the at least one fourth sensing input terminal receiving the first sensing test signal through a fourth external circuit; and
determining the condition of pin connection of the integrated circuit according to a third comparison result generated by comparing the first sensing test signal received by each of the at least one third sensing input terminal with the clock signal and a fourth comparison result generated by comparing the first sensing test signal received by each of the at least one fourth sensing input terminal with the clock signal.

15. The method of claim 14, wherein:
the integrated circuit further comprises a second sensing output terminal, a fifth sensing input terminal and a sixth sensing input terminal; and
the method further comprises:
transmitting a second sensing test signal through the second sensing output terminal;
the fifth sensing input terminal receiving the second sensing test signal through a fifth external circuit;
the sixth sensing input terminal receiving the second sensing test signal through a sixth external circuit; and
determining a condition of pin connection of the integrated circuit according to a fifth comparison result generated by comparing the second sensing test signal received by the fifth sensing input terminal with the clock signal and a sixth comparison result generated by comparing the second sensing test signal received by the sixth sensing input terminal with the clock signal.

16. The method of claim 15, wherein the integrated circuit is disposed on a glass panel, and each of the fifth external circuit and the sixth external comprises a circuit disposed on the glass panel.

17. The method of claim 11, wherein each of the first external circuit and the second external circuit comprises a circuit on a printed circuit board or a circuit on a flexible printed circuit.

18. The method of claim 11, wherein:
the integrated circuit further comprises a second sensing output terminal, a fifth sensing input terminal and a sixth sensing input terminal; and
the method further comprises:
transmitting a second sensing test signal through the second sensing output terminal;
the fifth sensing input terminal receiving the second sensing test signal through a fifth external circuit;
the sixth sensing input terminal receiving the second sensing test signal through a sixth external circuit; and
determining a condition of pin connection of the integrated circuit according to a fifth comparison result generated by comparing the second sensing test signal received by the fifth sensing input terminal with the clock signal and a sixth comparison result generated by comparing the second sensing test signal received by the sixth sensing input terminal with the clock signal.

19. A circuit system, comprising:
an integrated circuit, comprising:
a driver;
a first sensing output terminal, coupled to the driver, and configured to transmit a first sensing test signal;
a sensor;
a first sensing input terminal, coupled to the sensor, and configured to receive a second sensing test signal to the sensor; and
a second sensing input terminal, coupled to the sensor, and configured to receive a third sensing test signal to the sensor;
a first external circuit, coupled to the first sensing output terminal and the first sensing input terminal; and
a second external circuit, coupled to the first sensing output terminal and the second sensing input terminal, wherein the sensor is configured to compare the second sensing test signal with a clock signal to generate a first comparison result, and compare the third sensing test signal with the clock signal to generate a second comparison result.

* * * * *